(12) United States Patent
Fukuda et al.

(10) Patent No.: US 7,241,491 B2
(45) Date of Patent: Jul. 10, 2007

(54) POLYIMIDE METAL LAMINATE

(75) Inventors: Kazuyuki Fukuda, Sodegaura (JP);
Toshihiko Takaki, Sodegaura (JP);
Yasuhiko Haga, Sodegaura (JP); Eiji Ohtsubo, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/921,983

(22) Filed: Aug. 20, 2004

(65) Prior Publication Data

US 2005/0048297 A1    Mar. 3, 2005

(30) Foreign Application Priority Data

Aug. 27, 2003  (JP)  ............... 2003-302556
Jul. 9, 2004   (JP)  ............... 2004-202559

(51) Int. Cl.
*B32B 27/06*  (2006.01)
*B32B 15/08*  (2006.01)
*B32B 5/16*   (2006.01)

(52) U.S. Cl. ............ 428/331; 428/323; 428/457; 428/458; 428/473.5

(58) Field of Classification Search .......... 428/332
See application file for complete search history.

(56) References Cited

U.S. PATENT DOCUMENTS 6,313,233 B1 * 11/2001 Kurosawa et al. .......... 525/431

2004/0247907 A1  12/2004  Goda et al.

FOREIGN PATENT DOCUMENTS

| JP | 04-189867 A | 7/1992 |
|---|---|---|
| JP | 06-065375 A | 3/1994 |
| JP | 08-073739 A | 3/1996 |
| JP | 2002-293933 A | 10/2002 |
| KR | 2004-0062594 A | 7/2004 |

OTHER PUBLICATIONS

Kakimoto, "Polyimide-Silica Hybrid Materials Produced by the Sol-Gel Method," *Kogyozairyo*, 1998, pp. 32-36, vol. 46.

* cited by examiner

*Primary Examiner*—Monique R. Jackson
(74) *Attorney, Agent, or Firm*—Buchanan Ingersoll & Rooney PC

(57) ABSTRACT

The polyimide metal laminate has at least one resin layer produced from a silica-dispersed polyimide composition obtained by reacting (A) alkoxysilane and/or its partial hydrolysis polycondensate with (B) an amino-containing compound having a functional group capable of forming a bond with silica, in the presence of water in a polyimide solution and/or a polyamic acid solution.

6 Claims, No Drawings

POLYIMIDE METAL LAMINATE

BACKGROUND OF THE INVENTION

1. Field of the Invention

The present invention relates to a polyimide metal laminate having a silica-dispersed polyimide resin layer excellent in modulus of elasticity at high temperatures, dimensional stability, transparency, and adhesion to an inorganic compound substrate. Specifically, the present invention relates to a polyimide/metal laminate suitable as a substrate for chip on film (hereinafter, COF), which has at least one silica-dispersed polyimide resin layer, hardly permit a chip to sink in a polyimide resin layer upon jointing the chip to a metal wiring via Au—Au jointing or Au—Sn jointing by an inner lead bonder, and is used widely in a tape automated bonding (TAB) tape processing line.

2. Description of the Related Art

A polyimide metal laminate is produced by casting polyimide resin onto metallic foil or laminating a polyimide film with metallic foil. The polyimide/metal laminate can also be produced by sputtering or plating a metal layer on the surface of a polyimide film. The polyimide/metal laminate is widely used as a flexible print substrate and for TAB tape.

In recent years, a wiring pattern for a flexible print substrate obtained from a polyimide film came to be patterned more finely. From the viewpoint of the reliability of a mounding system in TAB line and chip/wiring connection, Au—Au jointing and Au—Sn jointing came to be widely used in chip mounting. However, when chip mounting by Au—Sn jointing is conducted in a polyimide/metal laminate having a thermoplastic polyimide layer formed on metallic foil to improve the adhesion etc. between the metal layer and the polyimide layer, there may arise a problem that wiring and chip bumps sink in the thermoplastic polyimide, the wiring deviates, the wiring is released from the polyimide, and plating soaks. When the wiring considerably sinks, the gap between the chip and the polyimide layer is decreased, thus causing problems such as failure to insert an under film, edge shortening, etc. The wiring deviation causes problems such as short-circuiting due to contact between adjacent wirings. These problems are considered attributable to deformation of the polyimide layer upon chip mounting, and it has been attempted to solve the problems by improving the modulus of elasticity of the polyimide resin layer at high temperatures (chip mounting temperature).

For example, in the method of laminating polyimide on metallic foil by a casting or laminating system, the following two attempts have been made. A first method is a method of producing a polyimide/metal laminate by adding inorganic fillers such as silica and alumina to a polyimide resin layer to improve the modulus of elasticity of the polyimide resin layer. In this method, however, there is a problem that by adding the fillers, the transparency of the polyimide resin layer is lowered so that after circuit processing, an image of metallic wiring cannot be recognized by viewing the face of the polyimide resin layer on which metal is not laminated, thus making positioning upon chip mounting with an inner lead bonder difficult. Another method is a method of producing a polyimide/metal laminate by using highly crystalline polyimide exhibiting high modulus of elasticity. This method is free of the above problem, but has disadvantages such as low production efficiency due to the poor drying properties inherent in the highly crystalline polyimide because such properties cause the air bubbles in the polyimide film upon producing a polyimide/metal laminate.

As a method of producing a metal laminate without using thermoplastic polyimide, a method that involves sputtering metal on a polyimide film is known. A polyimide/metal laminate produced by the sputtering system does not contain a thermoplastic resin layer, and thus there does not occur the phenomenon where a metal wiring sinks in the polyimide layer upon chip mounting. In the sputtering system, however, there is a disadvantage of easy deterioration in yield due to pinholes in the metal layer. To produce a pinhole-free polyimide/metal laminate, lamination of polyimide on metallic foil by a casting or laminating system is effective, but in this case, the above problems occur.

As techniques of improving the adhesion and dimensional stability of polyimide resin, techniques of making a silica/polyimide composite by a sol/gel method are known (see Industrial Materials, Vol. 46, 32 (1998), etc.). Usually, a typical method of finely dispersing silica particles in polyimide includes a method of sol/gel reaction in a solution of polyamic acid as a precursor of polyimide and a method of dehydration imidation of alkoxysilane oligomer-grafted polyamic acid.

As the former method, a method of producing a polyimide composition having silica particles dispersed finely therein, which comprises reacting amino-containing alkoxysilane or a derivative thereof and alkoxysilane in the presence of water in a polyamic acid solution and subsequent polyimidation thereof is disclosed in JP-A 8-73739. However, this patent application merely describes that a film produced by this method is excellent in transparency and tensile modulus of elasticity, and there is no description of specific applications thereof.

As the latter method, a method wherein alkoxy-containing silane-modified polyamic acid produced by reacting polyamic acid with an epoxy-containing alkoxysilane partial condensate is imidated by thermosetting is disclosed in JP-A 2002-293933. In this method, however, a step of introducing a precursor of fine silica particles into a specific position of polyamic acid may be required, and gelation occurs easily due to introduction of an oligomer into the polymer, and thus there is a limit to the type of usable polyimide.

As described above, the conventionally known polyimide/metal laminate has problems such as sinking, deviated wiring, release and plating soaking in the system for jointing of chip via Au—Au jointing, Au—Sn jointing etc. at high temperatures, or problems such as poor transparence of the polyimide layer, low efficiency of production of the laminate, and occurrence of pinholes in metal layer, and cannot cope sufficiently with wiring rendered finer in recent years.

SUMMARY OF THE INVENTION

An object of the present invention is to provide a polyimide metal laminate having a polyimide resin layer excellent in modulus of elasticity at high temperatures, transparency, dimensional stability, and adhesion to an inorganic compound substrate. According to the present invention, there can be provided a polyimide metal laminate suitable as COF substrate, which is free of problems such as sinking, wiring deviation, release and plating soaking and is widely used in TAB tape processing line.

The present inventors made extensive study, and as a result, they found that a polyimide/metal laminate having at least one silica-dispersed polyimide resin layer produced by a sol/gel method can solve the problems described above, and the present invention was thereby completed.

That is, the present invention relates to a polyimide metal laminate having at least one resin layer produced from a silica-dispersed polyimide composition obtained by reacting (A) alkoxysilane and/or its partial hydrolysis polycondensate with (B) an amino-containing compound having a functional group capable of forming a bond with silica, in the presence of water in a polyimide solution and/or a polyamic acid solution.

According to the present invention, there can be provided a polyimide metal laminate having a polyimide resin layer excellent in modulus of elasticity at high temperatures, dimensional stability, transparency, and adhesion to an inorganic compound substrate. This polyimide/metal laminate does not cause problems such as sinking, wiring deviation, release and plating soaking, even if Au—Au jointing and Au—Sn jointing are used in chip mounting. Accordingly, the polyimide metal laminate of the present invention can cope sufficiently with chips rendered highly dense in recent years and can be used effectively as a polyimide metal laminate for COF used widely in TAB tape processing line.

DETAILED DESCRIPTION OF THE INVENTION

Hereinafter, the present invention is described in more detail.

The polyimide metal laminate of the present invention comprises at least one resin layer produced from a silica-dispersed polyimide composition obtained by reacting (A) alkoxysilane and/or its partial hydrolysis polycondensate with (B) an amino-containing compound having a functional group capable of forming a bond with silica, in the presence of water in a polyimide solution and/or a polyamic acid solution.

It is important that the silica-dispersed polyimide resin used in the present invention is produced by reacting (A) alkoxysilane and/or its partial hydrolysis polycondensate with (B) an amino-containing compound having a functional group capable of forming a bond with silica, in the presence of water (sol/gel reaction) in a polyimide solution and/or a polyamic acid solution. According to production by this method, a polyimide composition containing silica having the maximum particle diameter of 100 nm dispersed finely therein can be obtained, and can be formed into a resin layer excellent in modulus of elasticity at high temperatures, dimensional stability, transparency, and adhesion to an inorganic compound substrate. This effect cannot be sufficiently brought about by polyimide resin produced by simply mixing silica particles with polyamic acid and/or polyimide, or by polyimide/silica composite resin obtained by reacting only (A) alkoxysilane and/or its partial hydrolysis polycondensate in the presence of water in a polyimide solution and/or a polyamic acid solution. Accordingly, such resin cannot be used in the polyimide/metal laminate of the present invention.

The alkoxysilane and/or its partially hydrolysis polycondensed compound (A) used in production of the silica-dispersed polyimide composition include, for example, alkoxysilane such as tetramethoxysilane (TMOS), tetraethoxysilane (TEOS), tetrapropoxysilane, tetraisopropoxysilane, methyltrimethoxysilane, methyltriethoxysilane, methyltripropoxysilane, methyltributoxysilane, ethyltrimethoxysilane, ethyltriethoxysilane, n-propyltrimethoxysilane, n-propyltriethoxysilane, isopropyltrimethoxysilane, isopropyltriethoxysilane, dimethyldimethoxysilane, dimethyldiethoxysilane, diphenyldimethoxysilane, diphenyldiethoxysilane, trifluoromethyltrimethoxysilane, trifluoromethyltrimethoxysilane, vinyltrimethoxysilane, vinyltriethoxysilane, phenyltrimethoxysilane, phenyltriethoxysilane, 2-(3,4-epoxycyclohexyl)ethyltrimethoxysilane, 3-glycidoxypropyltrimethoxysilane, 3-glycidoxypropyltriethoxysilane, 3-glycidoxypropylmethyldimethoxysilane, 3-glycidoxypropylmethyldiethoxysilane p-styryltrimethoxysilane, 3-methacryloxypropylmethyldimethoxysilane, 3-methacryloxypropylmethyldiethoxysilane, 3-methacryloxypropyltrimethoxysilane, 3-methacryloxypropyltriethoxysilane, 3-acryloxypropyltrimethoxysilane, 3-acryloxypropyltriethoxysilane, 3-chloropropyltriethoxysilane, 3-mercaptopropylmethyldimethoxysilane, 3-mercaptopropyltrimethoxysilane, 3-isocyanatopropyltriethoxysilane etc., and the partial hydrolysis polycondensate is obtained by hydrolysis and polycondensation of at least one of these alkoxysilane derivatives by an acid or alkali compound as a catalyst. Tetramethoxysilane or tetraethoxysilane is preferably used because of its high effect on modulus of elasticity at high temperatures and dimensional stability.

The amino-containing compound (B) having a functional group capable of forming a bond with silica, used in the present invention, is now described. The functional group capable of forming a bond with silica in the present invention is specifically a functional group capable of forming a bond such as a covalent bond, a hydrogen bond and an ionic bond with silica. The functional group capable of forming a covalent bond with silica includes, for example, an alkoxysilyl group, a silanol group etc., and the functional group capable of forming a hydrogen bond includes, for example, a hydroxyl group, a carboxyl group, an amino group etc. The functional group capable of forming an ionic bond includes, for example, an ammonium group etc. The amino-containing compound (B) having a functional group capable of forming a bond with silica is a compound having both a functional group capable forming a covalent bond, a hydrogen bond or an ionic bond with silica and an amino group in the same molecule.

The amino-containing compound (B) having a functional group capable of forming a bond with silica includes, but is not limited to, 3-aminopropyltrimethoxysilane, 3-aminopropyltriethoxysilane, 3-aminopropylmethyldimethoxysilane, 3-aminopropylmethyldiethoxysilane, N-2-(aminoethyl)-3-aminopropylmethyldimethoxysilane, N-2-(aminoethyl)-3-aminopropyltrimethoxysilane, 2-aminoethylaminomethyltrimethoxysilane, 3-aminopropyldimethylethoxysilane, 2-(2-aminoethylthioethyl)triethoxysilane, p-aminophenyltrimethoxysilane, N-phenyl-3-aminopropylmethyldimethoxysilane, N-phenyl-3-aminopropylmethyldiethoxysilane, N-phenyl-3-aminopropyltrimethoxysilane, N-phenyl-3-aminopropyltriethoxysilane, 2-aminoethanol, 3-amino-1-propanol, 2-amino-1-amino-1-butanol, 1-amino-2-butanol, 2-amino-1-butanol, 3-propanediol, 3-amino-1,2-propanediol, 4,2-(2-aminoethoxy)ethanol, 2-amino-2-methyl-1-propanol, 4-amino-2-methylbutanol, 3-aminopropionic acid, 2-aminopropionic acid, 4-amino-n-butyric acid, 5-amino-n-valeric acid, 2-aminoisovaleric acid, asparagine, aspartic acid, 2-amino-2-methyl-1,3-propanediol, 2-(2-aminoethylamino)ethanol, 2-aminoethane thiol, 2-aminoethanesulfonic acid, N,N-dimethyl-1,3-propanediamine, N-(3-aminopropyl)cyclohexylamine, 4-picolylamine, 3-picolylamine, 2-picolylamine, 4-(2-aminoethyl) pyridine, 3-(2-aminoethyl)pyridine, 4-aminomethyl piperidine, 1-amino-4-methyl piperazine, 3-amino-5-methyl pyrazole, 1-(3-aminopropyl)imidazole, 2-aminoethane-1-sulfonic acid, 3-aminopropanesulfonic acid, sulfanilic acid, 1,4-diaminobutane dihydrochloride, 1,5-diaminopentane dihydrochloride etc. Preferably, at least one kind of amino-containing compound selected form these compounds is used. Because of higher effect on modulus of elasticity at high temperatures, dimensional stability and adhesion, the functional group capable forming a bond with silica is more preferably an alkoxysilyl group, and the specifically used compound is more preferably 3-aminopropyltrimethoxysilane, 3-aminopropyltriethoxysilane etc.

The amount of the amino-containing compound (B) having a functional group capable of forming a bond with silica used in the present invention is determined such that the total amount of the amino-containing compounds (B) having a functional group capable of forming a bond with silica is 0.1 to 30 parts by weight, more preferably 0.1 to 20 parts by weight, still more preferably 0.1 to 15 parts by weight, relative to 100 parts by weight of the alkoxysilane and/or its partial hydrolysis polycondensate (A). When the amount of at least one kind of compound selected from the amino-containing compounds (B) having a functional group capable of forming a bond with silica is lower than 30 parts by weight, there is a higher effect on modulus of elasticity at high temperatures and dimensional stability, while when the amount is higher than 0.1 part by weight, transparency and adhesiveness are improved.

The polyimide solution and/or polyamic acid used in production of the silica-dispersed polyimide composition in the present invention is not particularly limited, and polyimide obtained from known diamines and acid dianhydrides can be used. The linear expansion coefficient of a polyimide film obtained from polyimide solution and/or polyamic acid solution is preferably $1\times10^{-6}$ to $70\times10^{-6}/°$ C., more preferably $5\times10^{-6}$ to $50\times10^{-6}/°$ C., still more preferably $5\times10^{-6}$ to $30\times10^{-6}/°$ C.

The diamines used as the starting material of the polyimide solution and/or polyamic acid used in production of the silica-dispersed polyimide composition in the present invention include, for example, 1,3-bis(3-aminophenoxy) benzene, 4,4-bis(3-aminophenoxy)biphenyl, 3,3'-diaminobenzophenone, p-phenylene diamine, 4,4'-diaminodiphenyl ether, 1,3-bis(3-(3-aminophenoxy) phenoxy) benzene, 1,3-bis(3-(4-aminophenoxy) phenoxy) benzene, 5,7-diamino-1,1,4,6-tetramethyl indaine, 1,3-bis(4-(3-aminophenoxy) phenoxy) benzene, 1,3-bis(3-(2-aminophenoxy) phenoxy) benzene, 1,3-bis(4-(2-aminophenoxy) phenoxy) benzene, 1,3-bis(2-(2-aminophenoxy) phenoxy) benzene, 1,3-bis(2-(3-aminophenoxy) phenoxy) benzene, 1,4-bis(3-(3-aminophenoxy) phenoxy) benzene, 1,4-bis(3-(4-aminophenoxy) phenoxy) benzene, 1,4-bis(3-(2-aminophenoxy) phenoxy) benzene, 1,4-bis(4-(3-aminophenoxy) phenoxy) benzene, 1,4-bis(4-(2-aminophenoxy) phenoxy) benzene, 1,4-bis(2-(2-aminophenoxy) phenoxy) benzene, 1,4-bis(2-(3-aminophenoxy) phenoxy) benzene, 1,4-bis(2-(4-aminophenoxy) phenoxy) benzene, 1,2-bis(3-(3-aminophenoxy) phenoxy) benzene, 1,2-bis(3-(4-aminophenoxy) phenoxy) benzene, 1,2-bis(3-(2-aminophenoxy) phenoxy) benzene, 1,2-bis(4-(4-aminophenoxy) phenoxy) benzene, 1,2-bis(4-(3-aminophenoxy) phenoxy) benzene, 1,2-bis(4-(2-aminophenoxy) phenoxy) benzene, 1,2-bis(2-(2-aminophenoxy) phenoxy) benzene, 1,2-bis(2-(3-aminophenoxy) phenoxy) benzene, 1,2-bis(2-(4-aminophenoxy) phenoxy) benzene, 1,3-bis(3-(3-aminophenoxy) phenoxy)-2-methyl benzene, 1,3-bis(3-(4-aminophenoxy) phenoxy)-4-methyl benzene, 1,3-bis(4-(3-aminophenoxy) phenoxy)-2-ethyl benzene, 1,3-bis(3-(2-aminophenoxy) phenoxy)-5-sec-butyl benzene, 1,3-bis(4-(3-aminophenoxy) phenoxy)-2,5-dimethyl benzene, 1,3-bis(4-(2-amino-6-methylphenoxy) phenoxy) benzene, 1,3-bis(2-(2-amino-6-ethylphenoxy) phenoxy) benzene, 1,3-bis(2-(3-aminophenoxy)-4-methylphenoxy) benzene, 1,3-bis(2-(4-aminophenoxy)-4-tert-butylphenoxy) benzene, 1,4-bis(3-(3-aminophenoxy) phenoxy)-2,5-di-tert-butyl benzene, 1,4-bis(3-(4-aminophenoxy) phenoxy)-2,3-dimethyl benzene, 1,4-bis(3-(2-amino-3-propylphenoxy) phenoxy) benzene, 1,2-bis(3-(3-aminophenoxy) phenoxy)-4-methyl benzene, 1,2-bis(3-(4-aminophenoxy) phenoxy)-3-n-butyl benzene, 1,2-bis(3-(2-amino-3-propylphenyl) phenoxy) benzene etc.

Only one of these compounds or two or more thereof may be used, but when a polyimide film is produced, two or more thereof are preferably used in order to facilitate regulation of drying properties and mechanical properties.

When two or more thereof are used, at least one is preferably a compound represented by the following formula (1):

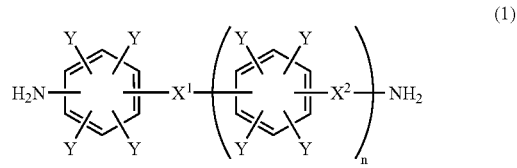

wherein $X^1$ and $X^2$ are independently selected from the group consisting of a single bond, an oxygen atom, a sulfur atom, a carbonyl group, a sulfonyl group, and a hydrocarbon group which may be substituted with a halogen atom, Ys are independently selected from the group consisting of a hydrogen atom, a halogen atom, a hydroxyl group, an alkoxy group, a nitro group, and a hydrocarbon group which may be substituted with a halogen atom, and n is an integer of 0 to 8. When two or more thereof are used, at least one is selected more preferably from 1,3-bis(3-aminophenoxy) benzene, 4,4-bis(3-aminophenoxy) biphenyl, 3,3'-diaminobenzophenone, p-phenylene diamine and 4,4'-diaminodiphenyl ether.

In the present invention, the acid dianhydrides used as the starting material of the polyimide solution and/or polyamic acid used in production of the silica-dispersed polyimide composition are not particularly limited, and any known acid dianhydrides can be used. Examples include pyromellitic dianhydride, 3,3',4,4'-biphenyl tetracarboxylic dianhydride, 3,3'4,4'-benzophenone tetracarboxylic dianhydride, 2,3,3',4'-biphenyltetracarboxylic dianhydride, bis(3,4-dicarboxyphenyl) ether dianhydride, bis(3,4-dicarboxyphenyl) sulfide dianhydride, bis(3,4-dicarboxyphenyl) sulfone dianhydride, bis(3,4-dicarboxyphenyl) methane dianhydride, 2,2-bis(3,4-dicarboxyphenyl) propane dianhydride, 2,2-bis(3,4-dicarboxyphenyl)-1,1,1,3,3,3-hexafluoropropane dianhydride, 1,3-bis (3,4-dicarboxyphenoxy) benzene dianhydride, 1,4-bis(3,4-dicarboxyphenoxy) benzene dianhydride, 4,4'-bis(3,4-dicarboxyphenoxy) biphenyl dianhydride, 2,2-bis[(3,4-dicarboxyphenoxy) phenyl]propane dianhydride, 2,3,6,7-naphthalene tetracarboxylic dianhydride, 1,4,5,8-naphthalene tetracarboxylic anhydride, butane-1,2,3,4-tetracarboxylic dianhydride, pentane-1,2,4,5-tetracarboxylic dianhydride, cyclobutane tetracarboxylic dianhydride, cyclopentane-1,2,3,4-tetracarboxylic dianhydride, cyclohexane-1,2,4,5-tetracarboxylic dianhydride, cyclohexa-1-ene-2,3,5,6-tetracarboxylic dianhydride, 3-ethylcyclohexa-1-ene-3-(1,2),5,6-tetracarboxylic dianhydride, 1-methyl-3-ethylcyclohexane-3-(1,2),5,6-tetracarboxylic dianhydride, 1-methyl-3-ethylcyclohexa-1-ene-3-(1,2),5,6-tetracarboxylic dianhydride, 1-ethylcyclohexane-1-(1,2),3,4-tetracarboxylic dianhydride, 1-propylcyclohexane-1-(2,3),3,4-tetracarboxylic dianhydride, 1,3-dipropylcyclohexane-1-(2,3),3-(2,3)-tetracarboxylic dianhydride, dicyclohexyl-3,4,3',4'-tetracarboxylic dianhydride, bicycle[2.2.1]heptane-2,3,5,6-tetracarboxylic dianhydride, bicycle[2.2.2]octane-2,3,5,6-tetracarboxylic dianhydride, bicycle[2.2.2]oct-7-ene-2,3,5,6-tetracarboxylic dianhydride etc. Among these dianhydrides, pyromellitic dianhydride, 3,3',4,4'-biphenyl tetracarboxylic dianhydride and 3,3',4,4'-benzophenone tetracarboxylic dianhydride are preferable. The reaction molar ratio of diamine to tetracarboxylic dianhydride is usually in the range of 0.75 to 1.25.

As the polyimide solution used in producing the silica-dispersed polyimide composition in the present invention, a polyimide having a repeating unit represented by the following general formula (3) is preferably used to confer particularly excellent heat resistance and mechanical properties, as well as solvent solubility and low dielectric properties.

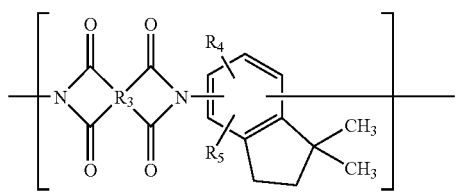

(3)

wherein $R_4$ and $R_5$ independently represent a hydrogen atom or a C1 to C20 alkyl group, and $R_3$ is at least one group selected from the group consisting of a condensed polycyclic aromatic group and the following groups:

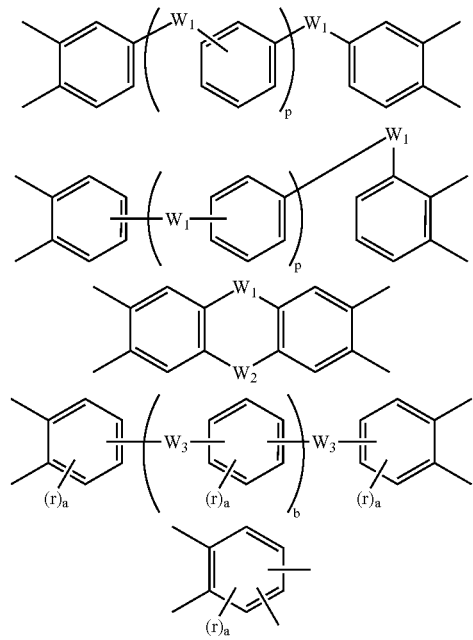

wherein $W_1$ represents —CO— or —C(=N_2)—, $W_2$ represents a direct bond, —CH_2—, —O—, —SO_2—, —S—, —CO— or —C(=N_2)—, $W_3$ represents a direct bond, —CH_2—, —C(CH_3)_2—, —C(CF_3)_2—, —S—, —SO—, —SO_2— or —O—, b is 0 or an integer of 1, p is 0 or an integer of 1, $(r)_a$ independently represent a C1 to C4 alkyl group, a halogen atom or a phenyl group, and n is 0 or an integer of 1 to 3.

The polyimide represented by the formula (3) is a known polyimide disclosed in JP-A 2002-356553; for example, the polyimide wherein each of $R_4$ and $R_5$ is a methyl group and $R_3$ is benzophenone can be synthesized for example by allowing 5,7-diamino-1,1,4,6-tetramethyl indaine obtained from m-xylene and isoprene to react with benzophenone tetracarboxylic dianhydride in an organic solvent.

Depending on the intended object, any other components may be contained in the polyimide solution and/or polyamic acid solution used in production of the silica-dispersed polyimide composition in the present invention. The polyimide solution and/or polyamic acid solution can be blended with for example a bismaleimide compound represented by the following formula (4):

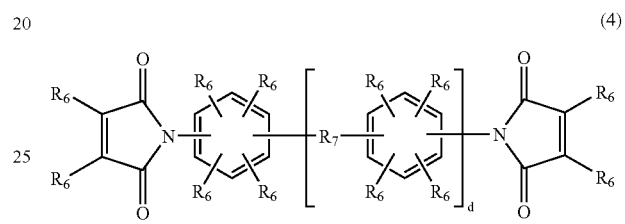

(4)

wherein d is an integer of 0 or more, each $R_7$ independently presents O, SO_2, S, CO, CH_2, C(CH_3)_2, C(CF_3)_2 or a direct bond. each $R_6$ independently represents a hydrogen atom, a halogen atom or a hydrocarbon group, and the positions of substituents on the benzene ring are independent of one another. In this case, the bismaleimide compound may be added to either the solution before the sol/gel reaction or the solution after the reaction. The amount of the bismaleimide compound added is not particularly limited, but is preferably about 5 to 25 wt % relative to the polyamic acid solution.

In the present invention, the following catalysts usable in hydrolysis and polymerization reaction may be added for the purpose of promoting the hydrolysis/polycondensation reaction of alkoxysilane in producing the silica-dispersed polyimide composition in the present invention. The catalyst used in hydrolysis/polymerization reaction of alkoxysilane includes catalysts used in general sol/gel reaction described in "Techniques of Manufacturing Functional Thin Film by Newest Sol/Gel Method" (in Japanese) (authored by Mitsuru Hirashima and published by K.K. Sogo Gijyutsu Center, P. 29) and "Science of Sol/Gel Method" (in Japanese) (authored by Sumio Sakubana and published by Agne Shofusha, P. 154). For example, the acid catalyst includes organic and inorganic acids such as hydrochloric acid, nitric acid, sulfuric acid, phosphoric acid, acetic acid, oxalic acid, tartaric acid and toluenesulfonic acid, and the alkali catalyst includes alkali metal hydroxides such as ammonium hydroxide, potassium hydroxide and sodium hydroxide, tertiary ammonium hydroxides such as tetramethyl ammonium hydroxide, tetraethyl ammonium hydroxide and tetrabutyl ammonium hydroxide, amines such as ammonia, triethylamine, tributylamine, morpholine, pyridine, piperidine, ethylene diamine, diethylene triamine, ethanol amine, diethanol amine and triethanol amine, and aminosilane such as 3-aminopropyltriethoxysilane and N(2-aminoethyl)-3-aminopropyl trimethoxysilane.

In addition, organotin compounds and metal alkoxides such as titanium tetraisopropoxide, diisopropoxy titanium bisacetyl acetonate, zirconium tetrabutoxide, zirconium tetrakisacetyl acetonate, aluminum triisopropoxide, aluminum tris-ethyl acetonate and trimethoxy borane can be used. The amount of the catalyst used is preferably 0.5 mol equivalent or less, more preferably 0.1 mol equivalent or less, relative to the total alkoxy groups in alkoxy silane, but is not limited insofar as the amino-containing compound (B) having a functional group capable of forming a bond with silica can act as a catalyst.

When the silica-dispersed polyimide composition is produced in the present invention, the amount of water added is preferably 10 mol equivalent or less, more preferably 3 mol equivalent or less, relative to the total alkoxy silane groups contained in the alkoxysilane and/or its partial hydrolysis polycondensate and the amino-containing compound (B) having a functional group capable of forming a bond with silica. The sol/gel reaction proceeds due to water contained in the polyimide solution and/or polyamic acid solution, and thus water may not be added in some cases.

In the present invention, the method of reacting the alkoxysilane and/or its partial hydrolysis polycondensate (A) with the amino-containing compound (B) having a functional group capable of forming a bond with silica, in the presence of water in a polyimide solution and/or a polyamic acid solution, includes the following methods: (1) a method which involves adding (A) and (B) simultaneously to a polyimide solution and/or a polyamic acid solution, stirring and mixing them, adding water and if necessary a catalyst, and reacting the mixture at a predetermined temperature, (2) a method that involves adding (B) to a polyimide solution and/or a polyamic acid solution, then mixing it under stirring, successively adding (A), water and if necessary a catalyst, and reacting the mixture at a predetermined temperature, (3) a method which involves adding (A) to a polyimide solution and/or a polyamic acid solution, then successively adding (B), water and if necessary a catalyst, and reacting the mixture at a predetermined temperature, and (4) a method which involves adding (A), water and if necessary a catalyst to a polyimide solution and/or a polyamic acid solution, then reacting the mixture at a predetermined temperature, adding (B) thereto, and continuing the reaction. Any of these methods can be used without any problems.

Preferable reaction concentration, temperature and time in hydrolysis/polycondensation of alkoxysilane in the present invention cannot be generalized because these conditions depend on one another and on the molecular weight of the polyimide and/or polyamic acid used. That is, if a high reaction temperature or a too long reaction time is used when the molecular weight of polyimide and/or polyamic acid is high or when the reaction concentration is high, the molecular weight of the reaction product is increased as the alkoxysilane is condensed, which may results in higher viscosity and gelation. Accordingly, the reaction concentration is usually preferably about 1 to 50%, more preferably 5 to 30%, in terms of nonvolatile content in the solution. The reaction temperature is preferably 1 to 100° C., more preferably 20 to 60° C., and the reaction time is preferably about 1 to 50 hours.

The maximum size of silica particles in the silica-dispersed polyimide composition used in the present invention is preferably 100 nm or less, more preferably 50 nm or less, still more preferably 20 nm or less. When the size of the particles is higher than 100 nm, a film obtained from the silica-dispersed polyimide composition is inferior in transparency so that after the polyimide/metal laminate provided by the present invention is processed to form a circuit, its positioning in chip mounting with an inner lead bond may be made difficult. The size and dispersed state of silica particles can be confirmed by observation under a transmission electron microscope (TEM) or atomic force microscope (AFM) or by X-ray scattering. In the present invention, silica particles in the silica-dispersed polyimide composition may not have a definite form, but it is estimated that given a size of 100 nm or more, separation of the silica phase does not occur. In the present invention, silica encompasses not only silicon dioxide but also silicon components having silanol groups and alkoxysilyl groups.

The content of silica ($SiO_2$) in the silica-dispersed polyimide composition in the present invention is preferably 1 to 50 parts by weight, more preferably 1 to 30 parts by weight, relative to 100 parts by weight of the polyimide. When the content is less than 50 parts by weight, deterioration in film strength hardly occurs. When the content is higher than 1 part by weight, the modulus of elasticity at high temperatures and adhesiveness are improved, and the effect on dimensional stability is increased. As used herein, the content of silica is the content of a silica condensate formed by the gel/sol reaction, and refers to the amount of ashes remaining after the organic components in the polyimide composition are calcined in air at 800° C.

In the present invention, the silica-dispersed polyimide composition preferably has a structure represented by the following general formula (2):

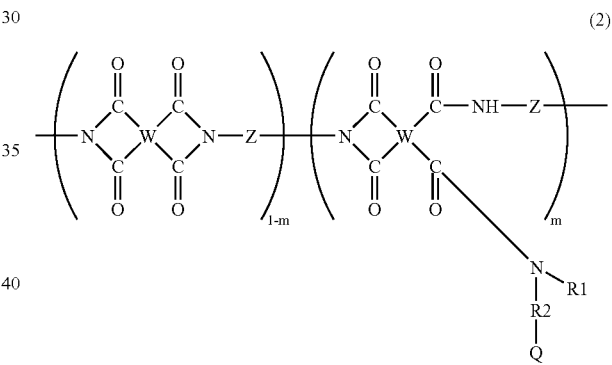

wherein W is a tetravalent organic group, Z and R2 independently represent a divalent organic group, R1 represents a hydrogen atom, a hydrocarbon group or an aromatic group, Q is a functional group capable of bonding to silica, m is a rational number of 0.001 to 0.5.

When the polyimide solution is used as the starting material in producing the silica-dispersed polyimide composition in the present invention, the resulting silica-dispersed polyimide composition has silica dispersed in the polyimide represented by the general formula (2) above. This is because the amino group contained in compound (B) reacts with the imide ring, whereby the functional group capable of forming a bond with silica is introduced into the polyimide compound. As a result, a bond such as a covalent bond, a hydrogen atom or an ionic bond can be formed between silica and polyimide. The reaction of the imide ring with the amino group can be confirmed by solid $^{15}$N-NMR measurement or FT-IR measurement.

In the general formula (2), W is not particularly limited insofar as it is a tetravalent organic group, and this group is usually a known residue of carboxylic dianhydride serving as the starting material of polyimide. Z is usually a divalent organic group, which is a known residue of diamine serving as the starting material of polyimide. R1 and R2 are monovalent and divalent organic groups respectively that are amino and silanol residues of the amino-containing alkoxysilane and/or amino groups of the amino-containing compound having a functional group capable of forming a bond with silica, and residues of functional groups capable of forming bonds with silica. When Q is a silanol group, it may react with a dispersed silica particle to form a siloxane bond. m is a rational number of 0.001 to 0.5, preferably 0.005 to 0.1.

The polyamide metal laminate of the present invention is a laminate having polyimide layer(s) and a metal layer, and is not particularly limited insofar as at least one of the polyimide layers is a resin layer obtained from the above-described silica-dispersed polyimide composition.

Specifically, the polyimide metal laminate of the present invention is produced for example by reacting the alkoxysilane and/or its partial hydrolysis polycondensate (A) with the amino-containing compound (B) having a functional group capable of forming a bond with silica, in the presence of water in a polyimide solution and/or a polyamic acid solution, then applying the resulting solution on metallic foil or on a polyimide layer, drying and curing it to form a silica-dispersed polyimide layer. In this case, another polyimide layer or a metal layer may be laminated on the silica-dispersed polyimide layer.

The polyimide metal laminate of the present invention may be prepared by thermal press bonding metallic foil and/or a polyimide/metal laminate onto a polyimide film having the silica-dispersed polyimide layer. Another polyimide layer or a metal layer may be further laminated on the silica-dispersed polyimide layer.

When a plurality of layers are formed as the polyimide resin layer in the polyimide metal laminate of the present invention, the silica-dispersed polyimide layer may be laminated directly on metallic foil or formed on an adhesive layer such as thermoplastic polyimide, may be placed in any position among resin layers, and may be used any times. The preferable position of the silica-dispersed polyimide resin layer is on metallic foil or on a thermoplastic polyimide layer formed on metallic foil.

The polyimide metal laminate of the present invention encompasses a single-sided plate having only one metallic foil layer laminated on the polyimide resin layer or a two-sided plate having metallic foils formed on both sides of the polyimide resin layer.

When the polyimide metal laminate of the present invention is produced, a method of applying a polyimide solution and/or a polyamic acid solution onto metallic foil or polyimide film can make use of known methods using a die coater, comma coater, roll coater, gravure coater, curtain coater, spray coater etc. Among these methods, a suitable method can be used depending on the thickness of a coating, the viscosity of varnish, etc. In the method of drying and curing the applied varnish, a usual heating drying oven can be used. As the atmosphere in the drying oven, it is possible to use air, an inert gas (nitrogen, argon) etc. The drying temperature is selected suitably depending on the boiling point of solvent, but is preferably in the range of 60 to 600° C. The drying time is selected suitably depending on thickness, concentration and solvent type, but is desirably about 0.05 to 500 minutes.

The method of thermally contact-bonding the polyimide includes a heat pressing method and/or a continuous laminating method. In the heat pressing method, metallic foil and polyimide cut off in a predetermined size in a pressing machine are layered and thermally contact-bonded by heat pressing.

The continuous laminating method is not particularly limited, and there is a method of sandwiching and laminating metallic foil and polyimide between rolls. The roll may be a metallic roll, rubber roll etc. The material of the roll is not limited, but a steel material or a stainless steel material is used in the metallic roll. A treatment roll provided with a hard chrome plating, tungsten carbide etc. to increase surface hardness is preferably used. The rubber roll preferably comprises heat-resistant silicon rubber or fluorine-based rubber formed on the surface of a metallic roll.

Continuous lamination may be conducted by belt lamination wherein two seamless stainless steel belts arranged between a pair of upper and lower metallic rolls arranged in series are pressurized by the metallic rolls and simultaneously heated by the metallic rolls or another heating source. The lamination temperature may be in the range of 200 to 400° C., and the heating system is preferably a conductive heating system, a radiation heating system by far infrared rays, an induction heating system, etc.

When the polyimide resin layer is formed into a plurality of layers, the laminate has layers consisting of polyimide obtained from known diamine compounds and acid dianhydrides, in addition to the silica-dispersed polyimide layer. These polyimide layers are not particularly limited, and known polyimide layers can be used. The starting material of such polyimide is not particularly limited and can be exemplified by the above-enumerated diamine compounds and acid dianhydrides. A preferable material is for example a polycondensate synthesized from at least one diamine selected from 1,3-bis(3-aminophenoxy)benzene, 4,4-bis(3-aminophenoxy)biphenyl, 3,3'-diaminobenzophenone, p-phenylene diamine and 4,4'-diaminodiphenyl ether and at least one tetracarboxylic dianhydride selected from pyromellitic dianhydride, 3,3',4,4'-biphenyl tetracarboxylic dianhydride, 3,3',4,4'-benzophenone tetracarboxylic dianhydride, but the material is not limited thereto. A polyimide layer containing the above-mentioned bismaleimide compound or the like can be used without any problems.

As other polyimide layer, a commercial polyimide film may be used. For example, UPILEX (registered trademark) S, UPILEX (registered trademark) SGA, UPILEX (registered trademark) SN (trade name, manufactured by Ube Industries, Ltd.), KAPTON (registered trademark) H, KAPTON (registered trademark) V, KAPTON (registered trademark) EN (trade name, manufactured by Toray Dupont), APICAL (registered trademark) AH, APICAL (registered trademark) NPI, APICAL (registered trademark) HP (trade name, manufactured by Kanegafuchi Chemical Industry Co., Ltd.), etc. These polyimide films can be used without any problems even if they are subjected to surface plasma treatment, corona discharge treatment etc.

As the metal used in the polyimide/metal laminate of the present invention, any metal used in flexible circuit boards can be used without particular limitation, and as preferable metal, mention may be made of at least one metal selected from the group consisting of copper, nickel, cobalt, chrome, zinc, aluminum, stainless steel and alloys thereof, more preferably copper and copper alloys, stainless steel and alloys thereof, nickel and nickel alloys (including alloy 42), aluminum and aluminum alloys. The metal is more preferably copper and copper alloys.

In the polyimide/metal laminate of the present invention, the thickness of the metallic foil is not particularly limited insofar as it can be utilized in the form of a tape, and the thickness is preferably 0.1 to 150 μm, more preferably 2 μm to 105 μm, still more preferably 3 μm to 35 μm. The thickness can be suitably selected from this range; for example, when fine pattern wiring processing is required, thinner foil is preferably used, while thicker foil is suitably used for wiring requiring rigidity or for large electric current.

In consideration of the balance between curling and dimensional stability, the polyimide/metal laminate of the present invention preferably has at least one polyimide layer, more preferably two or more layers, more preferably three or more layers.

In a preferable embodiment wherein the polyimide metal laminate of the present invention having three or more polyimide layers is produced, a first polyimide layer brought into contact with metal is preferably thermoplastic polyimide. The thickness of the first layer is preferably 0.1 to 10 μm, more preferably 0.2 to 5 μm, and the glass transition temperature is preferably 150 to 350° C., more preferably 150 to 300° C., and the average linear expansion coefficient at 100 to 200° C. is preferably $20 \times 10^{-6}$ to $70 \times 10^{-6}$/° C.

The polyimide used in a second layer is preferably non-thermoplastic polyimide, and the thickness is preferably 1 to 250 μm, more preferably 4 to 50 μm, still more preferably 5 to 40 μm. Polyimide having a glass transition temperature of 300° C. or more or having no glass transition temperature is preferable. The average linear expansion coefficient at 100 to 200° C. is preferably 5 to 30 ppm/° C., more preferably 5 to 20 ppm/° C.

The polyimide used in a third layer is preferably non-thermoplastic polyimide when the metal layer is one layer in one side, and the thickness is preferably 0 to 10 μm, more preferably 0.5 to 5 μm, and it is preferable that the glass transition temperature is 300° C. or more or there is no glass transition temperature. The average linear expansion coefficient at 100 to 200° C. is preferably $10 \times 10^{-6}$ to $60 \times 10^{-6}$/° C., more preferably $20 \times 10^{-6}$ to $40 \times 10^{-6}$/° C.

When there are metal layers on both sides of the laminate, the third polyimide is preferably thermoplastic polyimide, and the thickness is preferably 0.1 to 10 μm, more preferably 0.5 to 8 μm. The glass transition temperature is preferably 150 to 350° C., more preferably 150 to 300° C., and the average linear expansion coefficient at 100 to 200° C. is preferably $20 \times 10^{-6}$ to $70 \times 10^{-6}$/° C.

The silica-dispersed polyimide used in the present invention is superior in modulus of elasticity at high temperatures, dimensional stability (low linear expansion coefficient), transparency, and adhesion to an inorganic compound substrate. Due to the presence of at least one layer using this resin as the polyimide layer in the polyimide metal laminate, there is brought about a significant effect of preventing problems such as wire deviation, sinking, release and plating soaking with less deformation of the polyimide resin layer upon chip mounting at high temperatures and high pressure. Even if the crystallinity of the polyimide used in the silica-dispersed polyimide resin used in the present invention is low, the modulus of elasticity at high temperatures and dimensional stability can be improved by making the laminate as a composite with silica, and thus the silica-dispersed polyimide resin also has an effect of preventing-a reduction of productivity with good drying.

If the polyimide metal laminate of the present invention is used for COF used widely in TAB tape processing line in order to use the silica-dispersed polyimide layer constituting at least one of polyimide layers, the effect of the present invention can be preferably easily achieved when the modulus of elasticity at high temperatures is in the following range. That is, the storage elastic modulus E' at temperatures near to the mounting temperature used in Au—Sn jointing and Au—Au jointing is preferably 0.3 to 30 GPa, more preferably 0.5 to 15 GPa, still more preferably 0.8 to 10 GPa. The temperatures near the mounting temperature are 250 to 500° C., preferably 300 to 450° C., more preferably 350 to 450° C.

Because the silica-dispersed polyimide layer in the polyimide metal laminate of the present invention is so transparent that after circuit processing, an image of metallic wiring can be recognized through the face of the polyimide layer on which metal was not laminated, thus enabling positioning upon chip mounting with an inner lead bonder.

The polyimide metal laminate of the present invention uses metallic foil and is thus free of pinholes, and has a silica-dispersed polyimide layer excellent in modulus of elasticity at high temperatures, dimensional stability, transparency, and adhesion to an inorganic compound substrate, and is thus free of problems such as wiring deviation, sinking, release and plating soaking even in chip mounting via Au—Au jointing or Au—Sn jointing.

EXAMPLES

Hereinafter, the present invention is described in more detail by reference to the Examples, which however are not intended to limit the present invention. Abbreviations in the Examples are meant as follows. Evaluation in the Examples was conducted as follows.

DMAc: dimethyl acetamide
NMP: N-methyl-2-pyrrolidone
TMOS: tetramethoxysilane
TEOS: tetraethoxysilane
APTMOS: aminopropyltrimethoxysilane
2AE: 2-aminoethanol
DMPDA: N,N-dimethyl-1,3-propane diamine
4AMP: 4-aminomethyl piperidine
APB: 1,3-bis(3-aminophenoxy)benzene
m-BP: 4,4'-(3-aminophenoxy)biphenyl
ODA: 4,4'-oxydianiline(4,4'-diaminodiphenyl ether)
PPD: p-phenylene diamine
BTDA: 3,3',4,4'-benzophenone tetracarboxylic dianhydride
BPDA: 3,3',4,4'-biphenyl tetracarboxylic dianhydride
PMDA: pyromellitic anhydride
APB-BMI: 1,3-bis(3-maleimidophenoxy)benzene (Method of Evaluating IC Chip Mounting)

In known techniques, the polyimide metal laminate was subjected to circuit processing to match an IC chip (Phase 6-50, chip thickness 550 μm, 50 μm pitch Au plating bump, bump size: 30 μm height, 100 μm length, 25 μm width), then treated with an electroless tin plating treatment solution (Product No. LT-34, manufactured by Simpley Far East) at 70° C. for 3 minutes, washed sufficiently with water, and dried for 1 to 2 hours in a drying machine at 100 to 130° C. to give a flexible print circuit board. Thereafter, a circuit of the flexible print circuit board was positioned on the IC chip, and the IC chip and the flexible print substrate was thermally contact-bonded under the conditions of a temperature of 350 to 450° C., a pressure of 100 to 150 MPa and a time of 1 to 3 seconds. Thereafter, whether wiring deviation and soaking of the tin plating in the interface between polyimide and metal foil occurred or not on the wiring part on which the IC chip was mounted was confirmed by observing the flat polyimide side under an optical microscope (×1250), and whether wiring deformation, IC chip sinking, and release occurred or not was confirmed by observing a section of the product under an optical microscope (×1250).

(Measurement of Silica Content: Thermogravimetric Measurement)

The thermogravimetric measurement of the polyimide/silica film was conducted by a thermogravimetric unit (TGA-50 manufactured by Shimadzu Corporation) in the range of 30 to 800° C., and from the amount of ashes remaining after calcining the film at 800° C., the content of silica was calculated.

(Viscoelasticity Measurement: Measurement of Storage Elastic Modulus at 450° C.)

In evaluation of viscoelasticity, temperature dispersion measurement was conducted with RSA-II (manufactured by Rheometric Scientific Inc.) in a tensile deformation mode. The measurement was conducted under the following conditions: the temperature range 30 to 500° C.; a heating rate 3° C./min.; Auto-Strain regulation; strain 0.02%; and frequency 1 Hz. A sample of 20 mm in length and 5 mm in width was used to determine the storage elastic modulus E' at 450° C.

Synthesis Example 1

A vessel equipped with a stirrer and a nitrogen inlet tube was charged with 1532.4 g DMAc as solvent and then with 130.0 g APB, and stirred at room temperature until the sample was dissolved. Thereafter, 322.22 g BTDA was added thereto and stirred at 50 to 60° C. for about 4 hours to give a polyamic acid solution. The content of polyamic acid in the resulting polyamic acid solution was 15% by weight, and the viscosity E at 25° C. was 500 mPa·s.

Synthesis Example 2

A vessel equipped with a stirrer and a nitrogen inlet tube was charged with 261.0 g DMAc as solvent and then with 20.44 g ODA and 16.12 g m-BP, and the sample was dissolved at 20 to 30° C. under stirring. Thereafter, 30.84 g PMDA was added thereto, and the starting material adhering to the inside of the flask was washed away with 11.0 g DMAc, and the sample was heated at 50 to 60° C. under stirring for about 1 hour, and then 0.44 g PMDA was added thereto and stirred for about 4 hours at a temperature kept at 60° C., to give a varnish (A). Then, another vessel equipped with a stirrer and a nitrogen inlet tube was charged with 263.0 g NMP as solvent and then with 19.62 g PPD, and the sample was dissolved at 20 to 30° C. under stirring. Thereafter, 37.0 g BPDA and 11.06 g PMDA were added thereto, and the starting material adhering to the inside of the flask was washed away with 10.0 g NMP, and the sample was heated at 50 to 60° C. under stirring for about 4 hours, to give a varnish (B). Finally, another container equipped with a stirrer and a nitrogen inlet tube was charged with the varnishes (B) and (A) in the ratio of 93:7 by weight, and the mixture was heated at 50 to 60° C. under stirring for about 4 hours, to give a polyamic acid solution. The content of the polyamic acid in the resulting polyamic acid solution was 20 wt %, and the viscosity E at 25° C. was 30000 mPa·s. The linear expansion coefficient of a polyimide film obtained from the polyamic acid was 10 ppm/° C.

Synthesis Example 3

The polyamic acid obtained in Synthesis Example 2 was diluted to 15 wt % with NMP, and 18 g dilution was introduced into a 100-ml reaction vessel, and TMOS (1.245 g) and water (0.631 g) were added thereto, and the mixture was reacted at 60° C. for 1 hour. Then, an amino-containing alkoxysilane APTMOS (0.138 g) was added thereto and reacted at 60° C. for 5 hours, to give a varnish of the silica-dispersed polyamic acid composition. Before addition, the TMOS, APTMOS and water were diluted to 50 wt % with NMP.

Synthesis Example 4

A vessel equipped with a stirrer and a nitrogen inlet tube was charged with 1777.46 g DMAc as solvent and then with 80.0 g ODA and 50.06 g APB, and the sample was stirred at room temperature until it was dissolved. Thereafter, 123.87 g PMDA was added thereto and stirred at 50 to 60° C. for about 4 hours, and 128.21 g APB-BMI was added thereto and stirred for about 12 hours to give a polyamic acid solution. The content of polyamic acid in the resulting polyamic acid solution was 12.5% by weight, and the viscosity E at 25° C. was 100 mPa·s.

Synthesis Example 5

While referring to a method described in JP-A 2002-356553, polyimide represented by formula (5) below was synthesized from 5,7-diamino-1,1,4,6-tetramethyl indaine (obtained from m-xylene and isoprene) and benzophenone tetracarboxylic dianhydride. The logarithmic viscosity of the resulting polyimide was 0.55 dl/g. The logarithmic viscosity was determined after 0.50 g polyimide powder was dissolved in 100 ml N-methyl-2-pyrrolidone. The linear expansion coefficient of a film obtained from this polyimide was 45 ppm/° C.

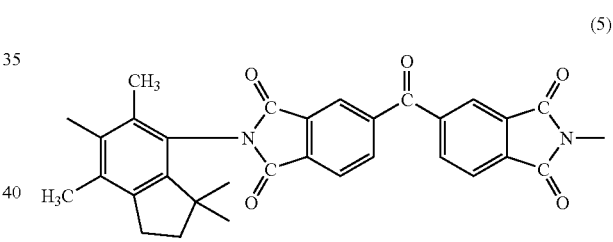

(5)

Example 1

A 100-ml reaction vessel was charged with 18 g polyamic acid/NMP solution (15 wt % polyamic acid) synthesized in Synthesis Example 2, and TMOS (1.245 g) and water (0.631 g) were added thereto and reacted at 60° C. for 1 hour. Then, amino-containing alkoxysilane APTMOS (0.138 g) was added thereto and reacted at 60° C. for 5 hours, to give a solution of the silica-dispersed polyamic acid composition. Before addition, the TMOS, APTMOS and water were diluted at 50 wt % with NMP.

The resulting polyamic acid solution was applied by a Baker applicator to a dry film thickness of about 15 μm onto copper foil and then dried in a nitrogen atmosphere at a heating rate of 3° C./min. from 50 to 180° C. in an inert oven. Then, the sample was heat-treated at a temperature from 280 to 380° C. in an IR re-flow furnace, to give a polyimide/copper laminate. The copper foil in the resulting laminate was treated for several minutes by spraying a ferric chloride solution (40 Baume) through a spray nozzle until the metallic foil was completely eliminated, and then the sample was washed with water and vacuum-dried at 60° C. to give a polyimide film. Physical properties of the resulting film are shown in Tables 1 and 2.

Examples 2 to 4

The same reaction as in Example 1 was carried out except that the conditions shown in Table 1 were used. From the solution reacted under the conditions shown in Table 1, a polyimide/metal laminate was produced in the same manner as in Example 1. Physical properties of the resulting film are shown in Tables 1 and 2.

Comparative Example 1 and 2

A polyimide/metal laminate was produced in the same manner as in Example 1 except that the conditions were changed to those shown in Table 1. Physical properties of the resulting film are shown in Tables 1 and 2.

Comparative Example 3

2.690 g colloidal silica/DMAc solution (20 wt % silica) was added to 18 g polyamic acid/NMP solution (15 wt % polyamic acid) in Synthesis Example 1, and the mixture was stirred at 60° C. for 5 hours to give a solution of the polyamic acid composition. From the resulting polyamic acid solution, a polyimide/metal laminate was produced in the same manner as in Example 1. Physical properties of the resulting film are shown in Tables 1 and 2.

(Measurement of Particle Sizes)

The silica-dispersed polyimide films obtained in Examples 1 and 2 and Comparative Examples 2 and 3 were observed under TEM, and the dispersed state of the silica was observed. The observation under TEM was conducted under the following conditions. The prepared polyimide film was embedded in epoxy resin, trimmed with a glass knife, and then cut into an ultra-thin film with a diamond knife. The ultra-thin film thus obtained was reinforced with carbon and observed at an accelerating voltage of 75 kV under a transmission electron microscope (TEM) (H-7000 manufactured by Hitachi, Ltd.).

As a result of observation under TEM, none of definite silica particles were observed, and a silica phase of 5 to 25 nm in size was observed in the resin layer in Examples 1 and 2, thus revealing that silica was uniformly dispersed. On the other hand, a large number of particles having a particle diameter of 1 μm or more were observed in Comparative Example 2. In Comparative Example 3, the silica particles were those having a primary particle diameter of 10 to 20 nm, but the particles were aggregated and inferior in the state of dispersion.

(Measurement of Light Transmittance)

Using an ultraviolet/visible spectrophotometer (UV2200 manufactured by Shimadzu Corporation), the transmittance of a film having the thickness shown in Table 2 was measured, and the average transmittance at wavelengths of 500 to 800 nm was determined. Although the film in Example 1 was thickest, this film showed the highest transmittance.

TABLE 1

|  | Polyamide solution (g) | TMOS (g), mmol in parentheses | APTMOS (g), mmol in parentheses | Water (g) | Silica (g) (theoretical) | Silica content (calculated) wt % | Silica content (found) wt % |
|---|---|---|---|---|---|---|---|
| Example 1 | 18 | 1.246 (8.19) | 0.138 (0.77) | 0.631 | 0.538 | 20 | 19.1 |
| Example 2 | 18 | 0.553 (3.63) | 0.061 (0.34) | 0.280 | 0.239 | 10 | 9.2 |
| Example 3 | 18 | 0.881 (5.79) | 0.098 (0.55) | 0.447 | 0.380 | 15 | 13.9 |
| Example 4 | 18 | 1.6585 (10.90) | 0.184 (1.03) | 0.841 | 0.716 | 25 | 24.6 |
| Comparative Example 1 | 18 | — | — | — | 0 | 0 | 0 |
| Comparative Example 2 | 18 | 1.341 (8.81) | — | — | 0.538 | 20 | 18.5 |
| Comparative Example 3 | 18 | — | — | — | 0.538 | 20 | 19.5 |

TABLE 2

|  | E @ 450° C. (GPa) | CTE (ppm/° C.) α 1 (100~200° C.) | CTE (ppm/° C.) α 2 (380~430° C.) | Light transmittance transmittance (%) | Light transmittance film thickness (μm) |
|---|---|---|---|---|---|
| Example 1 | 1.12 | 10 | 5 | 40.5 | 16.4 |
| Example 2 | 0.56 | — | — | — | — |
| Example 3 | 0.64 | — | — | — | — |
| Example 4 | 1.44 | — | — | — | — |
| Comparative Example 1 | 0.25 | 10 | 203 | 32.0 | 9.9 |
| Comparative Example 2 | 0.26 | — | — | 16.4 | 9.9 |
| Comparative Example 3 | 0.17 | — | — | 20.2 | 16.0 |

Example 5

10 g polyimide synthesized in Synthesis Example 5 was introduced into a 100 ml reaction vessel and dissolved in 40 g DMAc. Then, TMOS (1.215 g), amino-containing alkoxysilane APTMOS (0.0639 g), and 0.1 N hydrochloric acid (0.551 g) were added thereto and reacted at 25° C. for 5 hours, to give a solution of the polyimide composition. The resulting polyimide solution was applied by a Baker applicator to a dry film thickness of about 20 μm onto a glass substrate and copper foil and then dried at 70° C. for 30 minutes and at 160° C. for 5 hours, to prepare a polyimide/silica composite film and a polyimide/metal laminate, respectively.

(IR Measurement and Solid NMR Measurement)

An FT-IR spectrum of the resulting film was taken with FT-IR (FT/IR-300E manufactured by JASCO Corporation).

In the IR spectrum, a peak of amide at 1670 cm$_{-1}$, which was absent in a spectrum of neat polyimide, was observed. From this result, it was suggested that the imide ring of polyimide had reacted with the amino group of APTMOS.

To estimate the degree of reaction of the amino group with the imide ring, the following experiment was conducted. 10 g polyimide of formula (5) above was introduced into a 100-ml reaction vessel and dissolved in 40 g DMAc, followed by adding APTMOS (6.96 g) and 0.1 N hydrochloric acid (2.10 g), and the mixture was reacted at 25° C. for 5 hours to give a polyimide composition solution. This polyimide composition solution was applied by a Baker applicator to a dry film thickness of 20 μm, then dried at 70° C. for 30 minutes and at 160° C. for 5 hours to prepare a polyimide/silica composite film, and solid $^{15}$N-NMR spectrum of the film was taken. The solid $^{15}$N-NMR spectrum of the polyimide composite film was taken by the CPMAS method using CMX300 (manufactured by Chemagnetics). The external standard was NH$_4$Cl (18 ppm). In the taken spectrum, a peak of amide was observed at 109 ppm in addition to a peak of imide at 149 ppm and a peak of amine at 0 ppm. From the ratio of the peak intensities, it was found that 69% APTMOS had reacted with the imide ring. From the result, it was found that the polyimide composition obtained in Example 1 is a polyimide composition having about 10 nm silica particles dispersed in polyimide having a structure represented by the following general formula (6).

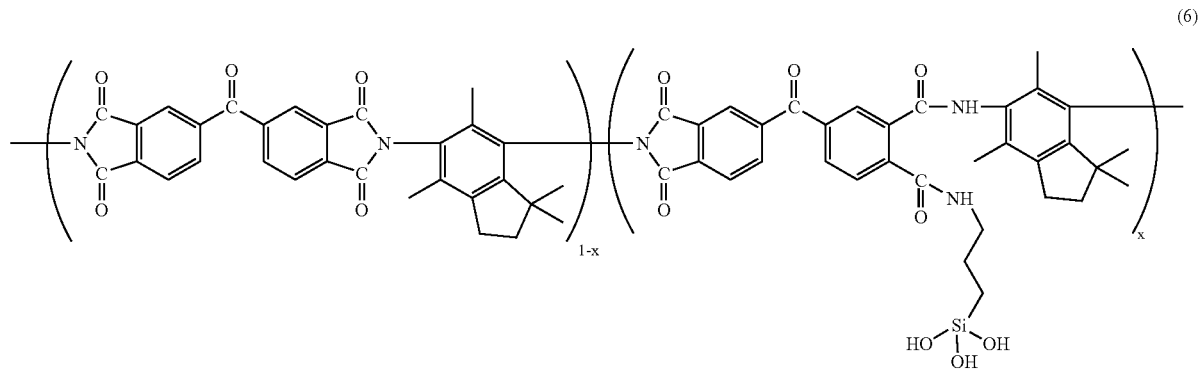

(6)

wherein the silanol group may have formed a siloxane linkage with a silica particle, and x satisfies the relationship: $0.012 \leq x \leq 0.018$.

Examples 6 to 9, Comparative Examples 5 to 6

The same reaction as in Example 5 was conducted except that the conditions were changed to those shown in Table 3. A film was prepared in the same manner as in Example 5.

(Measurement of Linear Expansion Coefficient)

An average linear expansion coefficient was determined by a tensile method wherein the extension (shrinkage) of the film was measured by changing the temperature in the range of 50 to 150° C. while applying a certain loading to both ends of the film by using a thermo-mechanical analyzer (TMA-50 manufactured by Shimadzu Corporation). The result is shown in Table 4.

(Adhesion Test)

The film formed on copper foil was provided with 100 crosscuts each having a size of 1 mm×1 mm. Then, a clear tape (Scotch 600-1-18D) was allowed to adhere well to the film and then released from the film, and from the amount of the film remaining on the copper foil, the adhesion of the film was evaluated. The number of remaining crosscuts out of 100 crosscuts (1 mm×1 mm) is shown in Table 4. A larger number of remaining crosscuts are indicative of higher adhesion.

(Observation Under TEM)

The prepared polyimide composite film was embedded in epoxy resin, then trimmed with a glass knife, and cut into an ultra-thin section with a diamond knife. The ultra-thin section thus obtained was reinforced with carbon and observed at an accelerating voltage of 75 kV under a transmission electron microscope (TEM) (H-7000 manufactured by Hitachi, Ltd.). By observation under TEM, the particle diameter of the silica particles was measured, and the dispersed state of the silica particles was confirmed.

(Light Transmittance)

The transmittance of the film of 2 μm in thickness was measured with an ultraviolet/visible spectrophotometer (UV2200 manufactured by Shimadzu Corporation), and the average transmittance at wavelengths of 500 to 800 nm was determined.

TABLE 3

| | Polyimide (g) | TMOS (g), mmol in parentheses | APTMOS (g), mmol in parentheses | 0.1 N HCl (g), mmol in parentheses | Silica (g) (theoretical) | Silica content (calculated) wt % | Silica content (found) wt % |
|---|---|---|---|---|---|---|---|
| Example 5 | 10 | 1.215 (7.98) | 0.0639 (0.356) | 0.551 (0.06) | 0.51 | 4.8 | 4.5 |
| Example 6 | 10 | 2.565 (16.85) | 0.135 (0.753) | 1.254 (0.13) | 1.07 | 9.6 | 9.5 |
| Example 7 | 10 | 4.074 (26.76) | 0.2144 (1.196) | 1.991 (0.20) | 1.70 | 14.5 | 14.0 |

TABLE 3-continued

|  | Polyimide (g) | TMOS (g), mmol in parentheses | APTMOS (g), mmol in parentheses | 0.1 N HCl (g), mmol in parentheses | Silica (g) (theoretical) | Silica content (calculated) wt % | Silica content (found) wt % |
|---|---|---|---|---|---|---|---|
| Example 8 | 10 | 1.122 (7.37) | 0.1247 (0.696) | 0.568 (0.06) | 0.49 | 4.6 | 4.0 |
| Example 9 | 10 | 2.368 (15.56) | 0.2632 (1.468) | 1.200 (0.12) | 1.03 | 9.3 | 9.0 |
| Comparative Example 4 | 10 | — | — | — | 0.00 | 0.0 | 0.0 |
| Comparative Example 5 | 10 | 1.313 (8.63) | — | 0.621 (0.06) | 0.53 | 5.0 | 4.3 |
| Comparative Example 6 | 10 | 2.772 (18.21) | — | 1.311 (0.13) | 1.11 | 10.0 | 9.5 |

TABLE 4

|  | Linear expansion coefficient (ppm/° C.) | Adhesion (number of remaining crosscuts/100) | Particle diameter of silica (nm) | Light transmittance (%) |
|---|---|---|---|---|
| Example 5 | 38 | 100 | 10 | 90 |
| Example 6 | 34 | 100 | 15 | 90 |
| Example 7 | 33 | 100 | 20 | 90 |
| Example 8 | 39 | 100 | 10 | 90 |
| Example 9 | 35 | 100 | 15 | 90 |
| Comparative Example 4 | 45 | 0 | — | 90 |
| Comparative Example 5 | 39 | 0 | >1000 | 60 |
| Comparative Example 6 | 36 | 0 | >1000 | 55 |

Example 10

10 g polyimide represented by formula (5) above was dissolved in 40 g DMAc in a 100 ml reaction container. Then, TEOS (3.792 g), amino compound 2AE (0.1113 g) and 0.1 N hydrochloric acid (0.327 g) were added thereto, and the mixture was reacted at 25° C. for 5 hours.

The resulting polyimide solution was applied by a Baker applicator to a dry film thickness of about 20 μm onto copper foil and then dried at 70° C. for 30 minutes and at 160° C. for 5 hours, to prepare a polyimide/copper foil laminate. The copper foil was etched with a ferric chloride solution to give a polyimide layer film. Physical properties of the resulting polyimide film are shown in Table 6. The liner expansion coefficient measurement, adhesion test, TEM observation and light transmittance measurement were conducted by the same methods as described above.

Examples 11 to 12, Comparative Examples 7 to 8

The same reaction as in Example 10 was conducted in the same manner as in Example 10 except for the conditions shown in Table 5. From the solution reacted under the conditions shown in Table 5, a film was prepared in the same manner as in Example 10, and physical properties of the resulting film are shown in Table 6.

TABLE 5

|  | Polyimide (g) | TEOS (g), mmol in parentheses | Amino-containing compound (g), mmol in parentheses |  | 0.1 N HCl (g), mmol in parentheses | Silica (calculated) wt % |
|---|---|---|---|---|---|---|
| Example 10 | 10 | 3.792 (18.20) | 2AE | 0.1113 (1.822) | 1.3107 (0.132) | 1.11 |
| Example 11 | 10 | 3.792 (18.20) | DMPDA | 0.1861 (1.822) | 13.107 (0.132) | 1.11 |
| Example 12 | 10 | 3.792 (18.20) | 4AMP | 0.208 (1.822) | 13.107 (0.132) | 1.11 |
| Comparative Example 7 | 10 | — | — | — | — | 0.00 |
| Comparative Example 8 | 10 | 3.792 (18.20) | — | — | 13.107 (0.132) | 1.11 |

TABLE 6

|  | Linear expansion coefficient (ppm/° C.) | Adhesion (number of remaining crosscuts/100) | Particle diameter of silica (nm) | Light transmittance (%) |
|---|---|---|---|---|
| Example 10 | 40 | 72 | 20 | 90 |
| Example 11 | 36 | 100 | 10 | 90 |
| Example 12 | 37 | 100 | 10 | 90 |

TABLE 6-continued

| | Linear expansion coefficient (ppm/° C.) | Adhesion (number of remaining crosscuts/100) | Particle diameter of silica (nm) | Light transmittance (%) |
|---|---|---|---|---|
| Comparative Example 7 | 45 | 0 | — | 90 |
| Comparative Example 8 | 36 | 0 | >1000 | 60 |

Example 13

The varnish prepared in Synthesis Example 4 was applied by a roll coater to a dry film thickness of about 0.5 μm onto metallic foil i.e. commercial copper foil (trade name: F0-WS, thickness 9 μm, manufactured by Koga Circuit Foil) and then dried at 80 to 100° C. for 1 minute. Subsequently, the varnish prepared in Synthesis Example 3 was applied by a comma coater to a dry film thickness of about 9 μm thereon and dried at 115 to 130° C. for 2 minutes. Subsequently, the varnish prepared in Synthesis Example 1 was applied by a roll coater to a dry film thickness of about 4 μm thereon and dried at 80 to 100° C. for 1 minute and then at 150 to 230° C. in a drying oven in an air-floating system, and then heat-treated in a furnace in a nitrogen atmosphere at 280 to 380° C. to give a laminate.

Thereafter, a commercial polyimide film (trade name: Kapton (registered trademark) 100EN, thickness 25 μm, manufactured by Toray Dupont) was laminated on the polyimide surface of the laminate and thermally contact-bonded at 260° C. at 2.5 MPa for 15 minutes, and then heat-treated at 350° C. in a nitrogen atmosphere, to give a polyimide/metal laminate.

As a result of evaluation in IC chip mounting, wiring deviation and tin soaking did not occur, and by observing a section of the laminate, wiring deformation and IC chip sinking were 1 μm or less, and wiring release was hardly observed.

Comparative Example 9

A polyimide/metal laminate was obtained in the same manner as in Example 13 except that the varnish in Synthesis Example 2 was used in place of the varnish in Synthesis Example 3.

As a result of evaluation in IC chip mounting, wiring deviation did not occur, but tin soaking was observed throughout wiring width in the interface between the wiring and the polyimide. By observing a section of the laminate, IC ship sinking was 1 μm or less, but wiring deformation of about 4 μm was observed, and wiring release was also observed.

INDUSTRIAL APPLICABILITY

According to the present invention, there can be obtained a polyimide/metal laminate having a polyimide layer excellent in modulus of elasticity at high temperatures, dimensional stability, transparency, and adhesion to an inorganic compound substrate. Accordingly, problems such as wiring deviation, sinking, release and plating soaking do not occur even in chip mounting via Au—Au jointing or Au—Sn jointing. Accordingly, the polyimide/metal laminate of the present invention can cope satisfactorily with wiring rendered highly dense in recent years and can be used effectively as a polyimide/metal laminate for COF used widely in tape automated bonding (TAB) tape processing line.

What is claimed is:

1. A polyimide metal laminate prepared by applying polyimide resin onto a metal foil and/or laminating polyimide film and a metal foil, said polyimide metal laminate comprising at least one resin layer produced from a silica-dispersed polyimide composition wherein the maximum size of the dispersed silica particles is less than 100 nm and the content of silica ($SiO_2$) in the silica-dispersed polyimide composition in the polyimide metal laminate is 1 to 50 parts by weight relative to 100 parts by weight of the polyimide and wherein the at least one resin layer is obtained by reacting (A) alkoxysilane and/or its partial hydrolysis polycondensate with (B) an amino-containing compound having a functional group capable of forming a bond with silica, in the presence of water in a polyimide solution and/or a polyamic acid solution wherein the storage elastic modulus E' at temperature of 250 to 500° C. of the polyimide metal laminate is 0.3 to 30 GPa.

2. The polyimide metal laminate according to claim 1, wherein the polyimide solution and/or the polyamic acid solution is a solution containing a polyimide copolymer and/or a polyamic acid copolymer synthesized from two or more diamine compounds and one or more tetracarboxylic dianhydrides.

3. The polyimide metal laminate according to claim 1, which comprises polyimide or polyamic acid produced by using, as at least one of the diamine compounds, a compound represented by the following formula (1):

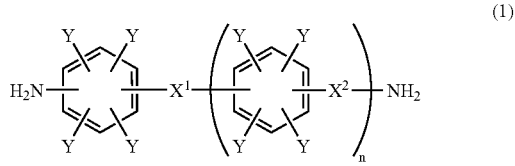

wherein $X^1$ and $X^2$ are independently selected from the group consisting of a single bond, an oxygen atom, a sulfur atom, a carbonyl group, a sulfonyl group, or a hydrocarbon group which may be substituted with a halogen atom, each Y independently presents selected from the group consisting of a hydrogen atom, a halogen atom, a hydroxyl group, an alkoxy group, a nitro group, and a hydrocarbon group which may be substituted with a halogen atom, and n is an integer of 0 to 8.

4. The polyimide metal laminate according to claim 1, wherein a polyimide film prepared from the polyimide solution and/or polyamic acid solution has a linear expansion coefficient of $1\times10^{-6}$ to $70\times10^{-6/°C}$.

5. The polyimide metal laminate according to claim 1, wherein the functional group capable of forming a bond with silica is an alkoxysilyl group.

6. The polyimide metal laminate according to claim 1, wherein the silica-dispersed polyimide composition is represented by the following formula (2):

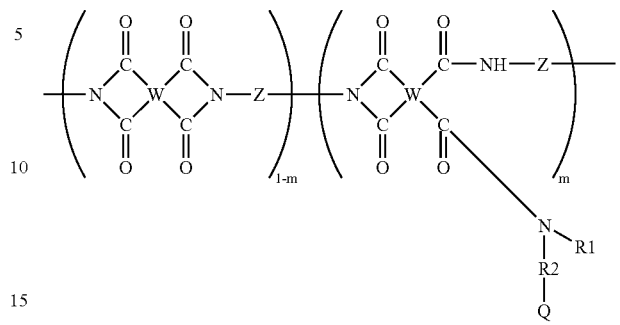

wherein W is a tetravalent organic group, Z and R2 independently represent a divalent organic group, R1 represents a hydrogen atom, a hydrocarbon group or an aromatic group, Q is a functional group capable of bonding to silica, m is a rational number of 0.001 to 0.5.

* * * * *